United States Patent

Moriyama et al.

[11] Patent Number: 5,859,759
[45] Date of Patent: Jan. 12, 1999

[54] SEMICONDUCTOR PRESSURE SENSOR MODULE

[75] Inventors: Kyoichi Moriyama; Katsumi Sakabe, both of Kawanishi; Motomi Ichihashi, Tokyo, all of Japan

[73] Assignee: Mitsubishi Denki Kabushiki Kaisha, Tokyo, Japan

[21] Appl. No.: 819,085

[22] Filed: Mar. 18, 1997

[30] Foreign Application Priority Data

Oct. 2, 1996 [JP] Japan ........................... 8-261647

[51] Int. Cl.⁶ .................. G01L 9/06; G01L 7/08
[52] U.S. Cl. ................. 361/283.4; 73/721; 73/727; 338/42
[58] Field of Search ................. 361/178, 283.4; 340/626; 307/118; 200/83 RA; 257/108, 415; 338/36, 42; 73/861.47, 715, 717, 719–721, 723, 725, 727

[56] References Cited

U.S. PATENT DOCUMENTS

| 4,129,042 | 12/1978 | Rosvold | 338/2 |
| 4,939,497 | 7/1990 | Nishida | 338/42 |
| 5,186,055 | 2/1993 | Kovacich | 73/727 |
| 5,257,547 | 11/1993 | Boyer | 338/4 |
| 5,454,270 | 10/1995 | Brown | 73/720 |

FOREIGN PATENT DOCUMENTS

| 6252421 | 9/1994 | Japan . |
| 7249729 | 9/1995 | Japan . |

*Primary Examiner*—Gerald P. Tolin

[57] ABSTRACT

The semiconductor pressure sensor has a pressure sensor unit with a pressure sensor chip for detecting pressure, peripheral circuitry for converting the pressure detected by the pressure sensor unit to an electrical signal and processing the electrical signal, a lead frame for fastening and electrically connecting peripheral circuitry, a package in which the peripheral circuitry and lead frame are integrated in a resin molding including a cavity in which the pressure sensor unit is housed, a cover for closing the opening of the cavity in which the pressure sensor unit is housed, and a pressure opening for conveying a pressure-conveying medium to the pressure sensor chip. The pressure sensor unit is fastened to the inside bottom of the cavity and is electrically connected to a particular part of the lead frame exposed inside the cavity.

11 Claims, 11 Drawing Sheets

SEMICONDUCTOR PRESSURE SENSOR MODULE

BACKGROUND OF THE INVENTION

1. Field of the Invention

The present invention relates to a pressure sensor used in such fields as automotives, home appliances, instrumentation and measuring devices, and medical equipment, and relates particularly to a semiconductor pressure sensor in which the peripheral circuitry integrated with the pressure sensor are manufactured as an integrated module.

2. Description of the Prior Art

Hybrid pressure sensor modules are one type of pressure sensor commonly used today in such fields as automotives, home appliances, instrumentation and measuring devices, and medical equipment. An overview of such a conventional pressure sensor is shown in FIG. 18.

The semiconductor pressure sensor 100 shown in FIG. 18 comprises a pressure opening 102 to a molded resin casing 101 having an airtight hollow core. A pressure sensor chip (not shown in the figures) is fastened on a pedestal by an adhesive and is electrically connected using gold wire or other conductor to the lead frame 103 inside the molded resin casing 101, thus forming the pressure sensor module 104. The thick-film circuit board 105 of the semiconductor pressure sensor 100 comprises a thick-film resistor and a printed multiple layer wiring pattern. The clip leads 106 disposed to the thick-film circuit board 105 are used to mount the semiconductor pressure sensor 100 on a printed circuit board.

The pressure sensor chip mentioned above comprises a pressure sensor element and a conversion circuit for converting the pressure detected by the pressure sensor element to an electrical signal. The pressure sensor module 104 is also mounted on the thick-film circuit board 105, and capacitors, resistors, and other chip components 107 that cannot be formed on the pressure sensor chip are surface mounted on the thick-film circuit board 105 and pressure sensor module 104.

The lead frame 103 is electrically connected to the wiring pattern of the thick-film circuit board 105, and the pressure sensor chip is electrically connected to the wiring pattern of the thick-film circuit board 105 by means of the lead frame 103 that is connected by gold wire or other conductor to the wiring pattern of the thick-film circuit board 105. The various terminals of the chip components 107 are electrically connected to the wiring pattern of the thick-film circuit board 105, and the clip leads 106 are also electrically connected to the wiring pattern of the thick-film circuit board 105.

The pressure opening 102 of this configuration is used to conduct a pressure-conveying medium to the pressure sensor element. The pressure-conveying medium applied from the pressure opening 102 enables the pressure sensor element of the pressure sensor module 104 to detect the applied pressure, and the detected pressure is then converted to an electrical signal by the conversion circuit. This semiconductor pressure sensor 100 and the signal processing circuit for accomplishing a particular process based on the electrical signal obtained from the conversion circuit are mounted on a printed circuit board and electrically connected to each other by the wiring pattern of that printed circuit board.

With rising demand for smaller, multiple function semiconductor pressure sensors in various fields, it has become necessary to develop integrated circuits combining the conversion circuit, thick-film circuit board 105, and a multifunction-capable signal processing circuit in what is essentially an IC package configuration. The semiconductor pressure sensor, however, is an element subject to mechanical displacements, and the area surrounding the pressure sensor element must be a hollow or airtight hollow. This has made it necessary to use a premolded hollow package to manufacture integrated pressure sensor modules containing a pressure sensor element and peripheral circuitry IC containing the conversion circuit, thick-film circuit board 105, and signal processing circuit. Furthermore, when the overall package is hollow, the peripheral circuitry IC must be protected because outside air and various pressure-conveying media may enter the airtight hollow chamber depending upon the pressure detection method used.

SUMMARY OF THE INVENTION

The object of the present invention is therefore to resolve the above problem and provide a semiconductor pressure sensor whereby device size can be reduced and the manufacturing process can be simplified, the semiconductor pressure sensor can be provided in forms suitable for different industries, and reliability can be assured.

To achieve the above objects, a semiconductor pressure sensor according to a first aspect of the invention has a pressure sensor unit for detecting the pressure of a pressure-conveying medium introduced from a pressure opening, and peripheral circuitry for converting the pressure detected by the pressure sensor unit to an electrical signal and processing said electrical signal, and comprises a package in which the peripheral circuitry fastened and electrically connected to the lead frame is formed with the lead frame from a molded resin body with a cavity in which the pressure sensor unit is housed, and a cover for closing the opening of the cavity in which the pressure sensor unit is housed. The pressure sensor unit is fastened to the inside bottom of the cavity and is electrically connected to a particular part of the lead frame exposed inside the cavity.

A semiconductor pressure sensor according to a second aspect of the invention has a pressure sensor unit for detecting the pressure of a pressure-conveying medium introduced from a pressure opening, and peripheral circuitry for converting the pressure detected by the pressure sensor unit to an electrical signal and processing said electrical signal, and comprises a package integrating a lead frame formed from a molded resin body with a recessed cavity for housing the pressure sensor unit, and a recessed sub-cavity for housing the peripheral circuitry, a cover for closing the opening of the cavity in which the pressure sensor unit is housed, and a resin sealer formed by flowing resin into the sub-cavity housing the peripheral circuitry. The peripheral circuitry in this embodiment is fastened and electrically connected to a particular part of the lead frame exposed inside the sub-cavity, and the pressure sensor unit is fastened to the inside bottom of the cavity and is electrically connected to a particular part of the lead frame exposed inside the cavity.

A semiconductor pressure sensor according to a third aspect of the invention forms the pressure opening as a through-hole in the bottom of the cavity during package formation, and the pressure sensor unit is disposed and fastened above the pressure opening.

A semiconductor pressure sensor according to a fourth aspect of the invention is characterized by the pressure sensor chip having a diaphragm formed at approximately the center thereof, the thin-wall side of the pressure sensor chip resulting from diaphragm formation being formed being bonded to the pedestal in which a through-hole is formed to introduce a pressure-conveying medium, said pedestal is fastened to the bottom of the cavity with the through-hole of the pedestal airtightly connected to the pressure opening, and said pressure sensor chip is electrically connected by corresponding lead wires to particular points of the lead frame exposed inside the cavity.

A semiconductor pressure sensor according to a fifth aspect of the invention is one wherein the pressure sensor unit is a pressure sensor chip having a diaphragm formed at approximately the center thereof, and said pressure sensor chip is disposed with the thin-wall side thereof resulting from diaphragm formation being formed bonded to the bottom of the cavity in a manner whereby the diaphragm is airtightly coupled with the pressure opening, and is electrically connected by corresponding lead wires to particular points of the lead frame exposed inside the cavity.

A semiconductor pressure sensor according to a sixth aspect of the invention modifies the fourth aspect such that when the cover is attached to the opening of the cavity, a vacuum is created in the cavity before sealing the cover to the opening.

A semiconductor pressure sensor according to a seventh aspect of the invention modifies the fourth or fifth aspects such that wherein the cover comprises a through-hole producing a pressure inside the cavity equal to the outside pressure.

A semiconductor pressure sensor according to an eighth aspect of the invention is modifies the first or second aspect such that wherein the pressure opening is formed by providing a through-hole in the cover.

A semiconductor pressure sensor according to a ninth aspect of the invention is one according to the eighth aspect wherein the pressure sensor unit is characterized by the pressure sensor chip having a diaphragm formed at approximately the center thereof, the thin-wall side of the pressure sensor chip resulting from diaphragm formation being formed bonded to a pedestal with a vacuum gap formed between the pressure sensor chip and pedestal, said pedestal is fastened to the bottom of the cavity, and said pressure sensor chip is electrically connected by corresponding lead wires to particular points of the lead frame exposed inside the cavity.

A semiconductor pressure sensor according to a tenth aspect of the invention has a pressure sensor unit for detecting the pressure of a pressure-conveying medium introduced from a pressure opening, and peripheral circuitry for converting the pressure detected by the pressure sensor unit to an electrical signal and processing said electrical signal, and comprises a package in which the peripheral circuitry fastened and electrically connected to the lead frame is formed with the lead frame from a molded resin body with a cavity in which the pressure sensor unit is housed, and a cover for closing the opening of the cavity in which the pressure sensor unit is housed and having a pressure opening formed from a through-hole. Said cavity is formed in the lead frame on the side to which the pressure sensor unit is mounted, and the pressure sensor unit is fastened and electrically connected at a particular part of the lead frame exposed inside the cavity.

A semiconductor pressure sensor according to an eleventh aspect of the invention is one according to the tenth aspect wherein the pressure sensor unit is characterized by the pressure sensor chip having a diaphragm formed at approximately the center thereof, the thin-wall side of the pressure sensor chip resulting from diaphragm formation being formed bonded to the pedestal with a vacuum gap formed between the pressure sensor unit and pedestal, said pedestal is fastened to particular points of the lead frame exposed inside the cavity, and the pressure sensor chip is electrically connected by corresponding lead wires to particular points of the lead frame exposed inside the cavity.

A semiconductor pressure sensor according to a twelfth aspect of the invention has a pressure sensor unit for detecting the pressure of a pressure-conveying medium introduced from a pressure opening, and peripheral circuitry for converting the pressure detected by the pressure sensor unit to an electrical signal and processing said electrical signal, and comprises a package in which the peripheral circuitry fastened and electrically connected to the lead frame is formed with the lead frame from a molded resin body with a cavity in which the pressure sensor unit is housed, and a cover for closing the opening of the cavity in which the pressure sensor unit is housed, and formed from an integral molding creating a sub-lead frame from molded resin and a through-hole forming a pressure opening. The cavity is formed in the lead frame on the side to which the pressure sensor unit is mounted, the pressure sensor unit is fastened to the cover and electrically connected at a particular part of the sub-lead frame, and the cover closes the opening in the cavity to enclose the fastened pressure sensor unit inside the cavity.

A semiconductor pressure sensor according to the thirteenth aspect of the invention is one according to the twelfth aspect wherein the pressure sensor unit is characterized by the pressure sensor chip having a diaphragm formed at approximately the center thereof, the thin-wall side of the pressure sensor chip resulting from diaphragm formation being formed being bonded to the pedestal in which a through-hole is formed to introduce a pressure-conveying medium, said pedestal is fastened to the cover with the through-hole of the pedestal airtightly connected to the pressure opening, and said pressure sensor chip is electrically connected by corresponding lead wires to particular points of the sub-lead frame exposed inside the cavity.

A semiconductor pressure sensor according to the fourteenth aspect of the invention is one according to the twelfth aspect wherein the pressure sensor unit is a pressure sensor chip having a diaphragm formed at approximately the center thereof, and said pressure sensor chip is disposed with the thin-wall side thereof resulting from diaphragm formation being formed bonded to the cover in a manner whereby the diaphragm is airtightly coupled with the pressure opening, and is electrically connected by corresponding lead wires to particular points of the sub-lead frame exposed inside the cavity.

A semiconductor pressure sensor according to a fifteenth aspect of the invention is one according to the twelfth aspect wherein the pressure sensor unit is characterized by the pressure sensor chip having a diaphragm formed at approximately the center thereof, the thin-wall side of the pressure sensor chip resulting from diaphragm formation being formed being bonded to a pedestal with a vacuum gap formed between the pressure sensor chip and pedestal, and said pedestal is fastened to the cover in a manner not blocking the pressure opening.

A semiconductor pressure sensor according to a sixteenth aspect of the invention is one according to the thirteenth aspect wherein when the cover is closed over the opening to the cavity, a vacuum is created in the cavity before sealing the cover.

A semiconductor pressure sensor according to a seventeenth aspect of the invention is one according to the thirteenth or fourteenth aspects wherein the cover comprises a through-hole producing a pressure inside the cavity equal to the outside pressure.

A semiconductor pressure sensor according to an eighteenth aspect of the invention is one according to any one of the twelfth through seventeenth aspects wherein the sub-lead frame is electrically connected at specific externally-exposed parts thereof to specific externally-exposed parts of the lead frame functioning as lead terminals for packaging the lead frame on a circuit board.

A semiconductor pressure sensor according to a nineteenth aspect of the invention is one according to any one of the twelfth through seventeenth aspects wherein specific parts of the lead frame and sub-lead frame are exposed externally as lead terminals for mounting on a circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Embodiment 1

Figure 1:
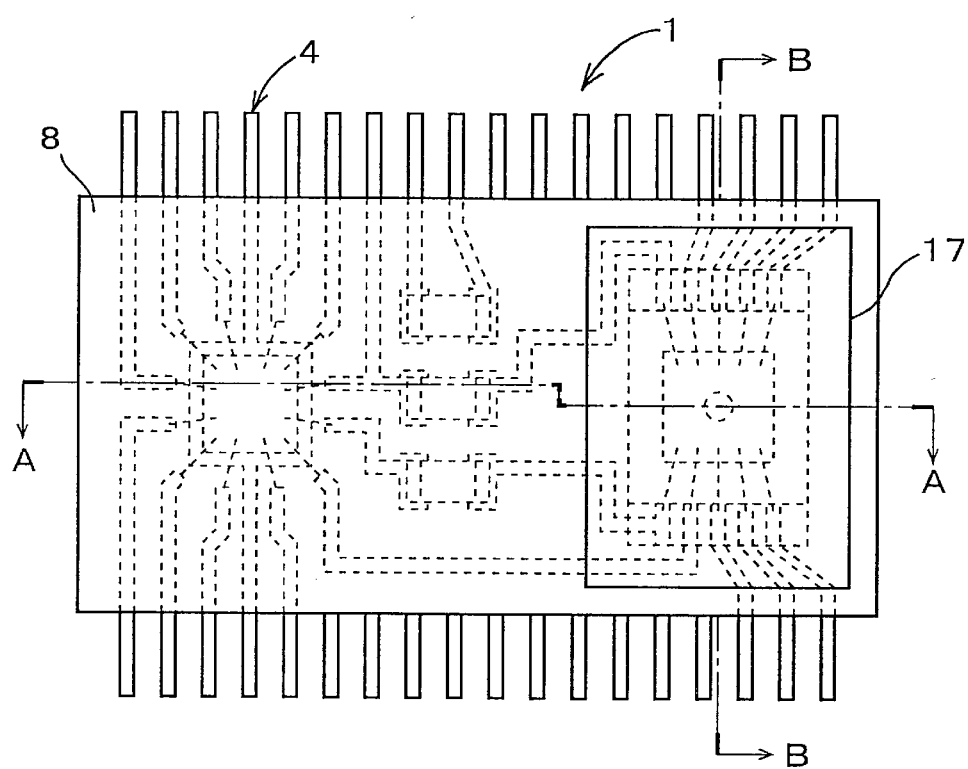
FIG. 1 is a plan view of an absolute pressure detecting semiconductor pressure according to the first embodiment of the present invention.
Figure 2:
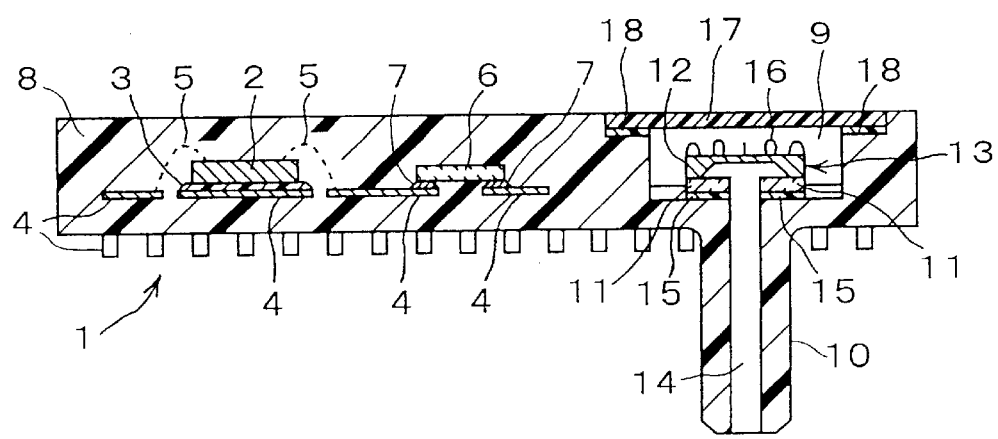
FIG. 2 is a cross sectional view through line A—A in FIG. 1.
Figure 3:
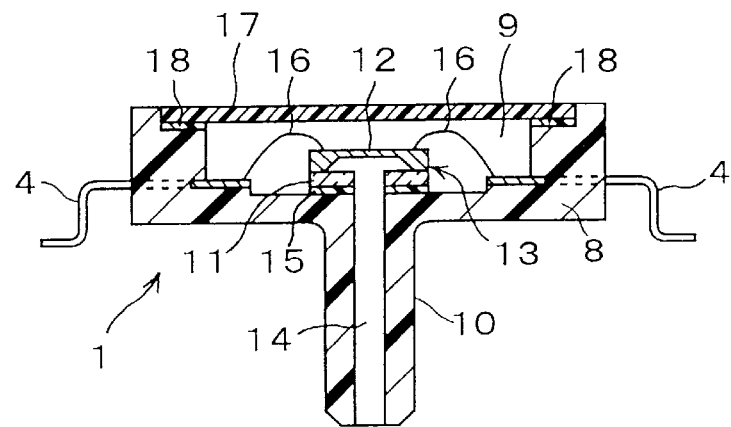
FIG. 3 is a cross sectional view through line B—B in FIG. 1.

FIG. 1 is a plan view of a semiconductor pressure sensor according to the first embodiment of the present invention. FIG. 2 is a cross sectional view through line A—A in FIG. 1, and FIG. 3 is a similar view through line B—B in FIG. 1. Note that the semiconductor pressure sensor shown in FIG. 1 to FIG. 3 uses by way of example only an absolute pressure detection semiconductor pressure sensor that detects the absolute value of the pressure.

Referring to FIG. 1 to FIG. 3, the IC 2 of the semiconductor pressure sensor 1 contains peripheral circuitry such as the conversion circuit for converting the detected pressure to an electrical signal, and signal processing circuitry for processing the electrical signal output by the conversion circuit as required. The IC 2 is fastened to specific locations on the lead frame 4 using a silicon or other adhesive 3, and is electrically connected to particular points of the lead frame wiring pattern using gold wire or other lead wire 5. Capacitors, resistors, and other chip components 6 that cannot be formed in the IC 2 are electrically connected with solder 7 to particular points of the lead frame 4.

A premolded resin package 8 is formed around the IC 2 and chip components 6. The package 8 is formed with a recessed cavity 9 in one part thereof and a resin-molded cylinder-like projection 10 formed from the outside bottom of the cavity 9 opposite the opening to the cavity 9. A through-hole is also formed inside the projection 10 to form a hollow cylinder, and this through-hole also passes through the bottom of the cavity 9. Note that the projection 10 is also formed during monolithic molding of the package 8.

The pressure sensor unit 13 is formed by cathodically bonding the pressure sensor chip 12, which is formed with a thin wall diaphragm in the middle, to a flat, rectangular glass pedestal 11 having a through-hole in the center for introducing a pressure-conveying medium. The pressure sensor unit 13 is then fastened to the inside bottom of the cavity 9 using a silicon or other adhesive 15 so that the through-holes in the projection 10 and pedestal 11 are aligned to form pressure opening 14. Note that the side of pressure sensor chip 12 in which the wall was thinned to form the diaphragm is bonded to the pedestal 11 so that approximately the center of the diaphragm is positioned over the pressure opening 14.

The pressure sensor chip 12 is made from n single crystal silicon with boron or another p impurity introduced to the surface of the diaphragm (the surface of the pressure sensor chip 12) by thermal diffusion or ion injection to form four piezoresistances thereon. These piezoresistances are interconnected to form a bridge circuit by means of diffusion lines formed by implanting a high density p impurity or aluminum lines formed by vapor deposition. This bridge circuit thus concentrates stress on each of the piezoresistances.

Figure 4:
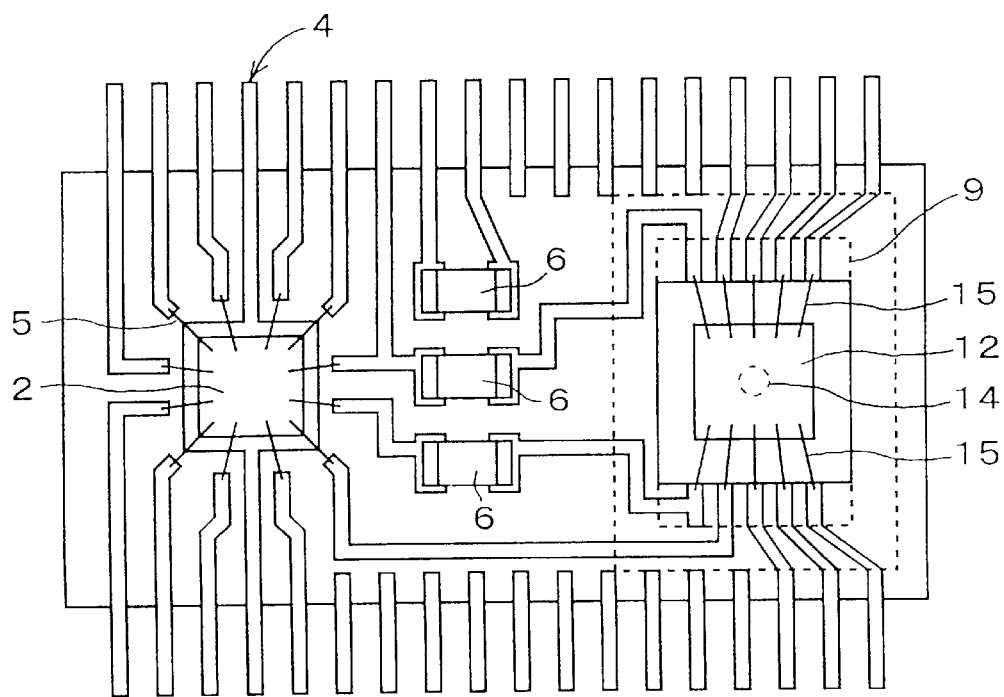
FIG. 4 shows by way of example only the wiring pattern of the lead frame 4 in the semiconductor pressure sensor 1 shown in FIG. 1.

The specific wiring pattern of the lead frame 4 is also exposed inside the cavity 9, and the pressure sensor chip 12 is electrically connected using gold or other lead wires 16 to particular points of the lead frame wiring pattern inside the cavity 9. FIG. 4 shows by way of example only the wiring pattern of the lead frame 4 in the semiconductor pressure sensor 1 shown in FIG. 1. Note that as shown in FIG. 4 the pressure sensor chip 12 is connected by way of the lead frame 4 to the IC 2 and chip components 6 in the semiconductor pressure sensor 1.

The opening to the cavity 9 is covered by a resin cover 17 to protect the pressure sensor chip 12. This cover 17 is bonded in place using an epoxy, silicon, or other adhesive 18, and thus seals the cavity 9. Note that the cavity 9 is sealed in a vacuum state at this time. Because the semiconductor pressure sensor 1 is an absolute pressure detecting pressure sensor that detects the absolute value of the detected pressure, and the cover 17 is bonded and the pressure opening 14 is formed to achieve an airtight state inside the cavity 9. Note, further, that the IC 2 and chip components 6 jointly constitute the peripheral circuitry.

Note also that as shown in FIG. 3 the bottom of the cavity 9 to which the pressure sensor unit 13 is bonded is recessed below the surface on which the lead frame 4 is exposed. This is because bonding a pedestal 11 to the pressure sensor chip 12 to form the pressure sensor unit 13 increases the height of the pressure sensor unit 13. It is therefore necessary to recess the pressure sensor unit mounting surface to avoid making the connections between the pressure sensor chip 12 and the lead frame 4 in the cavity 9 using bonded lead wires 16 too difficult.

Thus configured, the pressure sensor chip 12 detects the pressure of the pressure medium introduced through the pressure opening 14 by means of the change in the resistance of piezoresistors, for example. This detected pressure is then output by the pressure sensor chip 12 to the IC 2 and chip components 6 via the lead frame 4, and the IC 2 and chip components 6 then convert the detected pressure to an electrical signal, apply specific signal processing operations to this electrical signal, and communicate with the external devices connected to the lead frame 4.

It should be noted that while the first embodiment of the invention has been described with reference to an absolute pressure detecting semiconductor pressure sensor 1, the first embodiment of the invention can also be applied to gauge pressure detecting semiconductor pressure sensors that detect relative pressure referenced to, for example, the atmospheric pressure.

Figure 5:
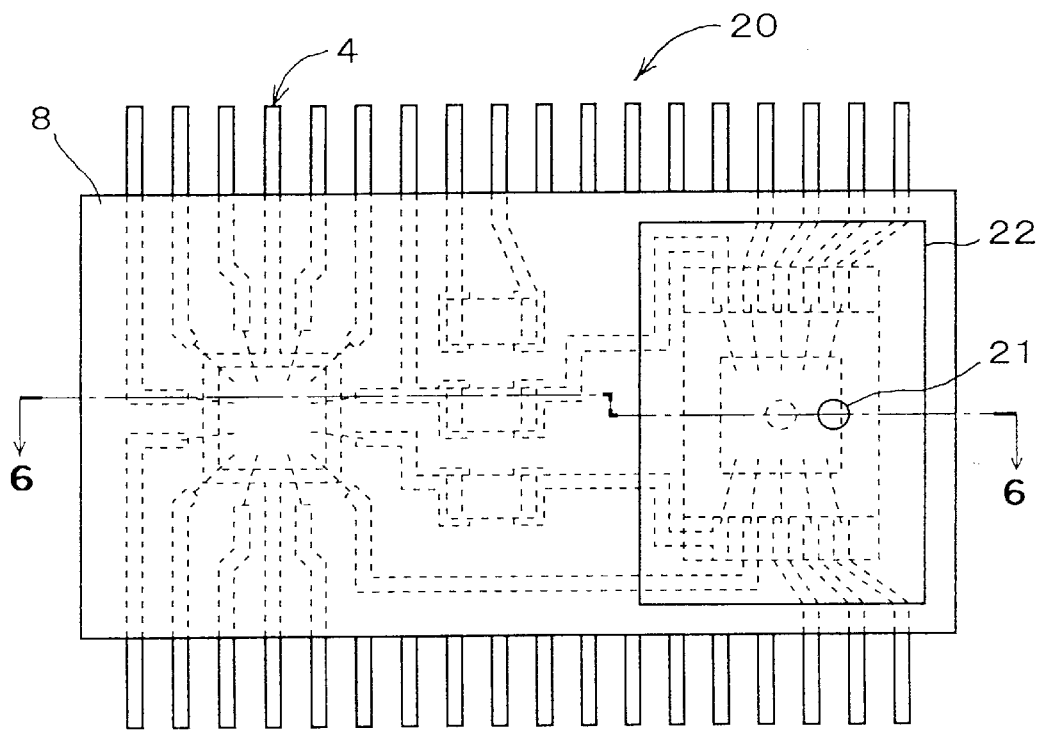
FIG. 5 is a plan view showing an example of a gauge pressure detecting semiconductor pressure sensor according to the first embodiment of the present invention.
Figure 6:
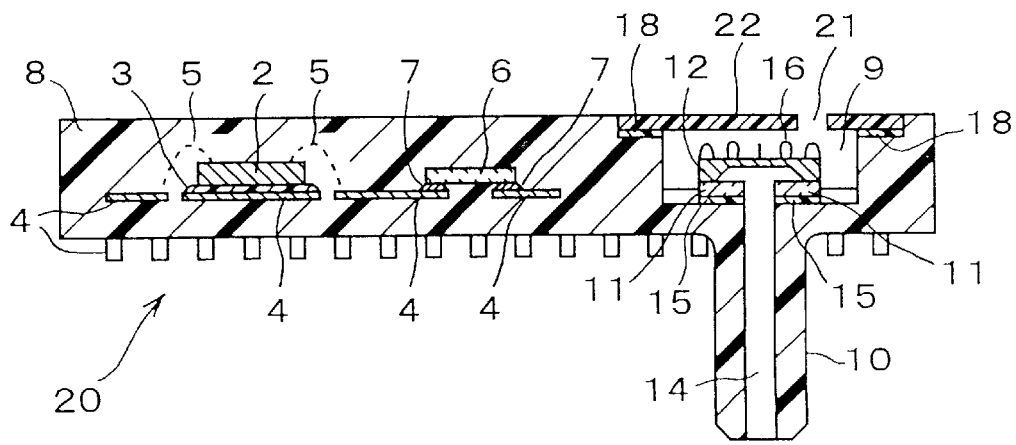
FIG. 6 is a cross sectional view through line C—C in FIG. 5.

FIG. 5 is a plan view showing an example of a gauge pressure detecting semiconductor pressure sensor according to the first embodiment of the present invention, and FIG. 6 is a cross sectional view through line C—C in FIG. 5.

The difference between the embodiment shown in FIG. 5 and FIG. 6 and that in FIG. 1 and FIG. 2 is that a through-hole 21 is formed in the cover 17 to equalize the pressure inside the cavity 9 to the atmospheric pressure. As a result, this cover 17 is referenced as cover 22 below, and the semiconductor pressure sensor 1 is referenced as semiconductor pressure sensor 20. Other than this difference the semiconductor pressure sensor 20 is identical to the semiconductor pressure sensor 1 shown in FIG. 1 to FIG. 4, the through-hole 21 equalizes the internal pressure of the cavity 9 to the atmospheric pressure, and the pressure sensor chip 12 thus detects the relative pressure of the pressure-conveying medium introduced from the pressure opening 14 to the air pressure inside the cavity 9.

As described above, the semiconductor pressure sensor of the first embodiment of the present invention features a general-purpose IC-like construction in which the IC 2 and chip components 6 forming the conversion circuit, signal processing circuit, and other peripheral circuitry are encased in a resin molding containing in the same package a cavity 9 forming a hollow in which the pressure sensor chip 12 is mounted.

By thus integrating both the pressure sensor chip and peripheral circuitry in the same molded integrated package, size can be reduced and reliability can be assured by premolding the peripheral circuitry. By also reducing the number of moving parts, the manufacturing process can be simplified, and the present invention can be used to provide general applicability with either gauge pressure detecting or absolute pressure detecting semiconductor pressure sensors.

Embodiment 2

While the IC 2 and chip components 6 are premolded in the first embodiment above, it is also possible to provide in addition to the cavity 9 for mounting the pressure sensor chip 12 another cavity for mounting the IC 2 and chip components 6 as in the second embodiment described below.

Figure 7:
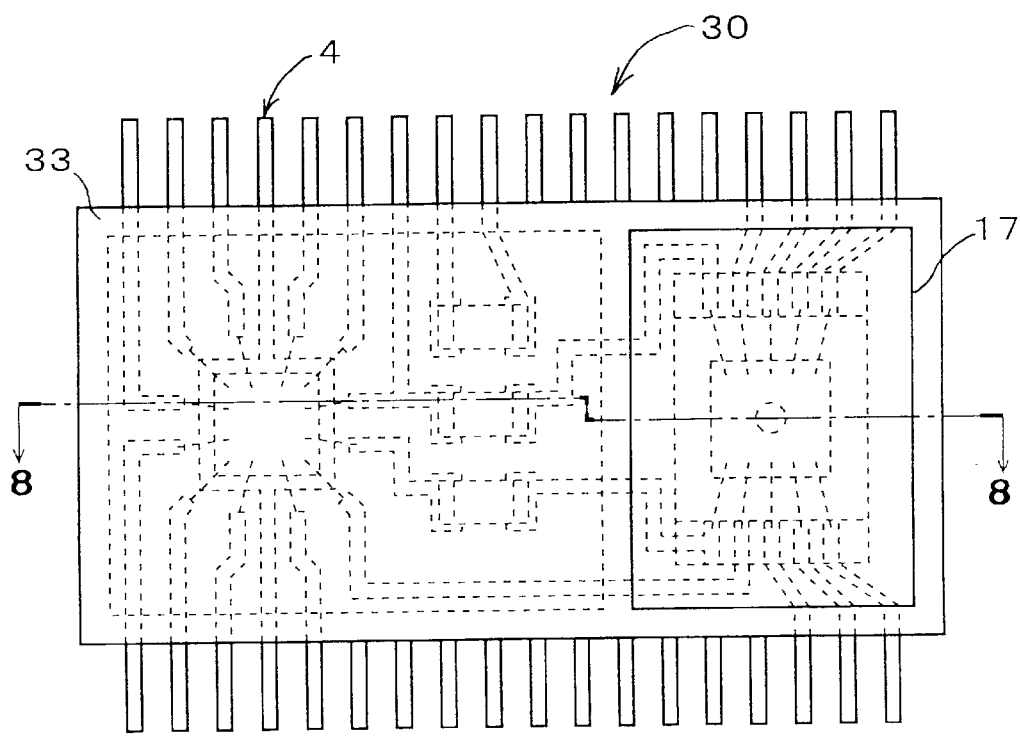
FIG. 7 is a plan view of a semiconductor pressure sensor according to the second embodiment of the invention.
Figure 8:
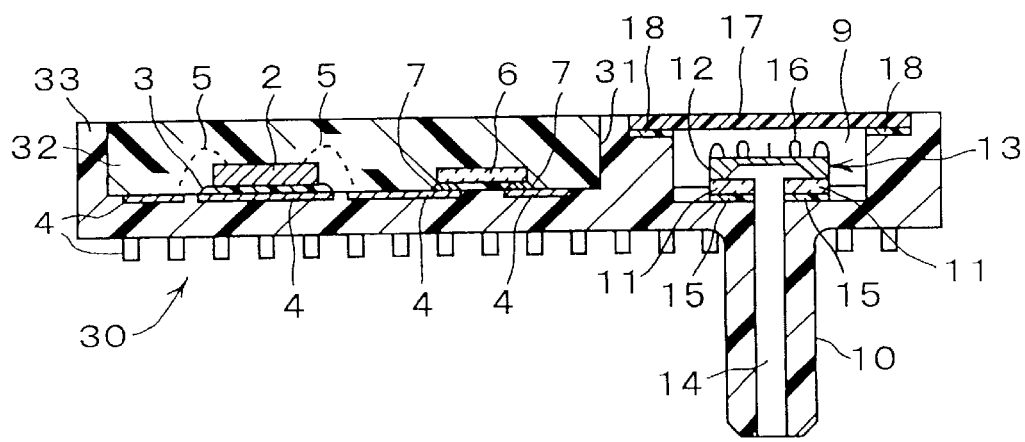
FIG. 8 is a cross sectional view through line D—D in FIG. 7.

FIG. 7 is a plan view of a semiconductor pressure sensor according to the second embodiment of the invention, and FIG. 8 is a cross sectional view through line D—D in FIG. 7. Note that like parts in FIG. 1 to FIG. 3 and FIGS. 7 and 8 are identified by like reference numbers, and further description thereof is omitted below where only the differences between this second embodiment and the first embodiment shown in FIG. 1 to FIG. 3 are described. Note, further, that the semiconductor pressure sensor shown in FIG. 7 and FIG. 8 is described below by way of example only as an absolute pressure detecting semiconductor pressure sensor for detecting the absolute value of the pressure.

The semiconductor pressure sensor shown in FIG. 7 and FIG. 8 differs from that in FIGS. 1–3 in that a large rectangular recessed cavity 31 for mounting the IC 2 and chip components 6 is also provided. After mounting the IC 2 and chip components 6, a sealing resin 32 is flowed into the cavity 31. As a result, the package 8 shown in FIGS. 1–3 is referenced as package 33, and the semiconductor pressure sensor 1 shown in FIGS. 1–3 is referenced as semiconductor pressure sensor 30.

Figure 9:
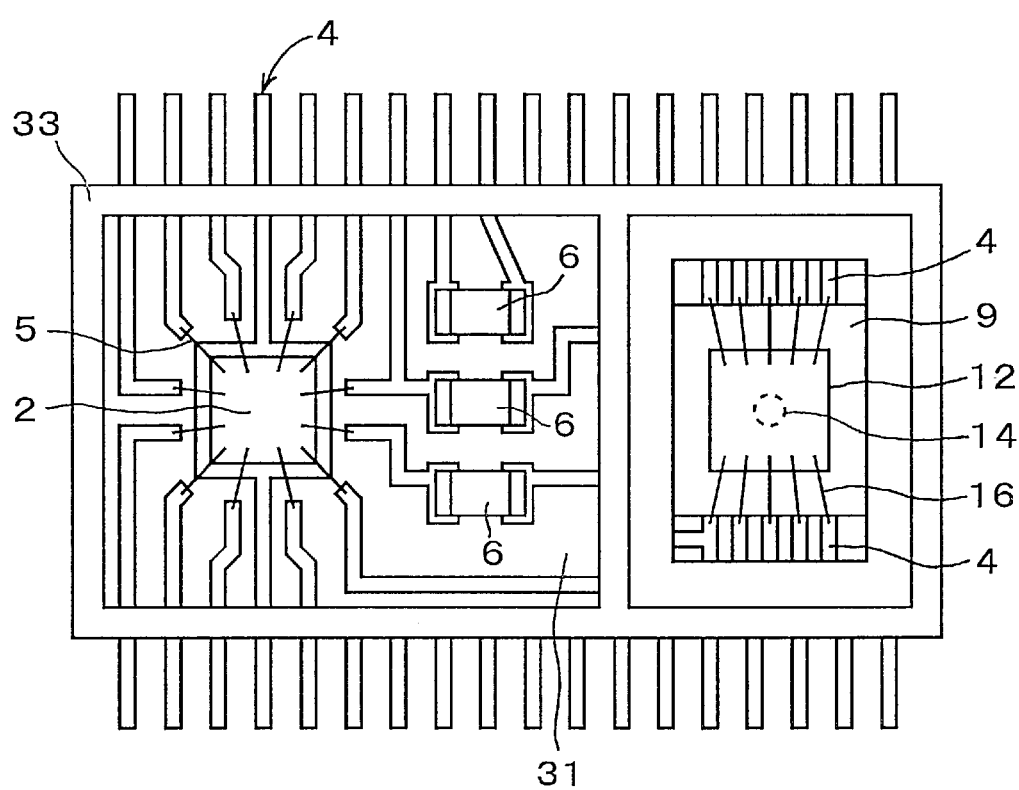
FIG. 9 is a plan view of the semiconductor pressure sensor 30 before the sealing resin 32 is flowed into the cavity 31 in FIG. 7.

FIG. 9 is a plan view of the semiconductor pressure sensor 30 before the sealing resin 32 is flowed into the cavity 31. Note that in FIG. 9 the lead frame 4 is premolded from resin to form a molded resin package 33. This package 33 thus comprises both cavity 9 and package 33. As shown in FIG. 8, a resin-molded cylinder-like projection 10 is formed from the outside bottom of the cavity 9 opposite the opening to the cavity 9. A through-hole is also formed inside the projection 10 to form a hollow cylinder, and this through-hole also passes through the bottom of the cavity 9. Note that cavity 31 functions as a subcavity, and the projection 10 is also formed during monolithic molding of the package 33.

The IC 2 is fastened to specific locations on the lead frame 4 using a silicon or other adhesive 3, and is electrically connected to particular points of the lead frame wiring pattern using gold wire or other lead wire 5. Capacitors, resistors, and other chip components 6 that cannot be formed in the IC 2 are electrically connected with solder 7 to particular points of the lead frame 4. The pressure sensor unit 13 is then fastened to the inside bottom of the cavity 9 using a silicon or other adhesive 15 so that the through-holes in the projection 10 and pedestal 11 are aligned to form pressure opening 14. The pressure sensor chip 12 is then electrically connected using gold or other lead wires 16 to particular points of the lead frame wiring pattern inside the cavity 9.

A gel or other sealing resin 32 is then flowed into the cavity 31, and the opening to the cavity 9 is covered by a resin cover 17 to protect the pressure sensor chip 12. This cover 17 is bonded in place using an epoxy, silicon, or other adhesive 18, and thus seals the cavity 9. Note that the cavity 9 is sealed in a vacuum state at this time. Because the semiconductor pressure sensor 1 is an absolute pressure detecting pressure sensor that detects the absolute value of the detected pressure, and the cover 17 is bonded and the pressure opening 14 is formed to achieve an airtight state inside the cavity 9.

The semiconductor pressure sensor 30 thus comprised according to the second embodiment operates identically to the semiconductor pressure sensor 1 of the first embodiment above.

It should be noted that while this second embodiment of the invention has been described with reference to an absolute pressure detecting semiconductor pressure sensor, the second embodiment of the invention can also be applied to gauge pressure detecting semiconductor pressure sensors that detect relative pressure referenced to, for example, the atmospheric pressure as described in the first embodiment above. In this case a through-hole 21 is provided in the cover 17 of the semiconductor pressure sensor 30 as in the semiconductor pressure sensor 20 shown in FIG. 5 and FIG. 6.

As thus described above, a cavity 31 for mounting the IC 2 and chip components 6 is provided in addition to the cavity 9 for mounting the pressure sensor chip 12 in this embodiment, the cavity 31 is then filled with a sealing resin 32 after mounting the IC 2 and chip components 6 to the lead frame 4 inside the cavity 31, thus achieving a structure similar to that of a general-purpose integrated circuit, and the pressure sensor chip 12 is mounted inside a second cavity 9. As a result, the effects achieved by the second embodiment are identical to those of the first embodiment.

Embodiment 3

Whereas a pedestal 11 is used in the gauge pressure detecting semiconductor pressure sensors according to the first and second embodiments above, a gauge pressure detecting semiconductor pressure sensor according to the third embodiment described below eliminates this pedestal 11. Note that this third embodiment is described using by way of example the gauge pressure detecting semiconductor pressure sensor of the first embodiment, this third embodiment can also be achieved in a gauge pressure detecting semiconductor pressure sensor according to the second embodiment above, and further description thereof is thus omitted below.

Figure 10:
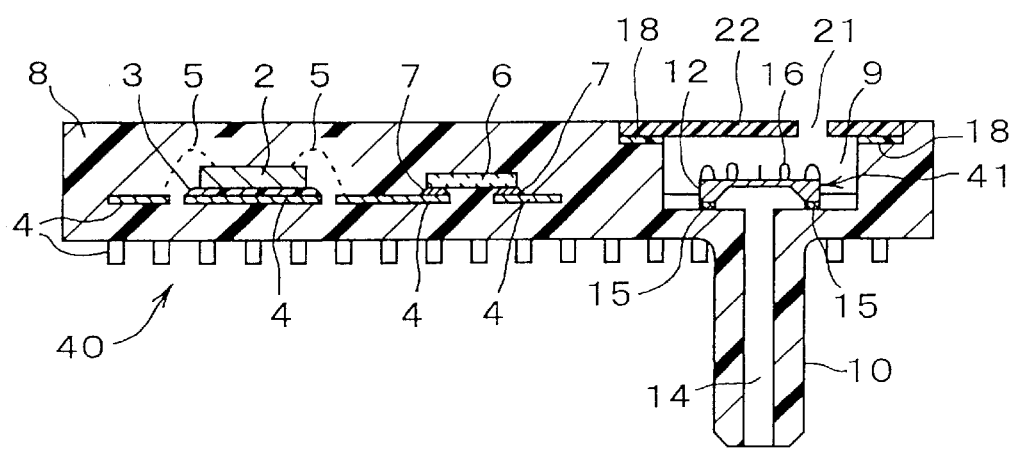
FIG. 10 is a plan view of a semiconductor pressure sensor according to the third embodiment of the invention.

FIG. 10 is a plan view of a semiconductor pressure sensor according to the third embodiment of the invention. Note that like parts in FIG. 10 and FIGS. 5 and 6 are identified by like reference numbers, and further description thereof is omitted below where only the differences between this third embodiment and the second embodiment shown in FIG. 6 are described.

FIG. 10 differs from FIG. 6 in that the pressure sensor chip 12 is bonded directly to the bottom of the cavity 9 by an adhesive 15 without using a pedestal 11. The pressure sensor unit 13 is therefore referenced as pressure sensor unit 41 below, and the semiconductor pressure sensor 1 as semiconductor pressure sensor 40.

Referring to FIG. 10, the pressure sensor chip 12 is bonded to the bottom of the cavity 9 by an adhesive 15 with the thin-wall side of the pressure sensor chip 12 in which the diaphragm is formed bonded to the bottom of the cavity 9. The pressure sensor chip 12 is positioned at this time so that approximately the middle of the diaphragm is above the pressure opening 14. The pressure sensor chip 12 is then electrically connected using gold or other lead wires 16 to particular points of the lead frame 4 wiring pattern inside the cavity 9. The opening to the cavity 9 is also sealed with a resin cover 22 bonded by an adhesive 18 to protect the pressure sensor chip 12.

The through-hole 21 formed in the cover 22 thus equalizes the pressure inside the cavity 9 to the atmospheric pressure, and the pressure sensor chip 12 thus detects the relative pressure of the pressure-conveying medium introduced from the pressure opening 14 to the air pressure inside the cavity 9. Note that the adhesion area of the pressure sensor chip 12 bonded to the bottom of the cavity 9 is small and the adhesion strength is therefore low. As a result, a pedestal must be used in absolute pressure detecting sensors.

As described above, the semiconductor pressure sensor of the third embodiment of the present invention features a general-purpose IC-like construction in which the IC 2 and chip components 6 forming the conversion circuit, signal processing circuit, and other peripheral circuitry of a relative pressure detecting semiconductor pressure sensor are encased in a resin molding containing in the same package a cavity 9 forming a hollow in which the pressure sensor chip 12 is mounted without using a pedestal.

It is therefore possible by means of a gauge pressure detecting semiconductor pressure sensor according to the third embodiment of the invention to eliminate the cost of a pedestal, reduce overall unit size by integrating both the pressure sensor chip and peripheral circuitry in the same molded integrated package, and assure reliability by pre-molding the peripheral circuitry. It is also possible to reduce the number of moving parts, and thereby simplify the manufacturing process.

Embodiment 4

In the first and second embodiments of the invention a projection 10 is provided to form a pressure opening 14. It is also possible, however, with an absolute pressure detecting semiconductor pressure sensor to dispose the pressure opening in the cover 17 without providing a projection 10 as per the fourth embodiment described below. Note, further, that while this fourth embodiment is described below with reference to the absolute pressure detecting semiconductor pressure of the first embodiment, it can also be achieved in the absolute pressure detecting semiconductor pressure of the second embodiment, and further description thereof is thus omitted below.

Figure 11:
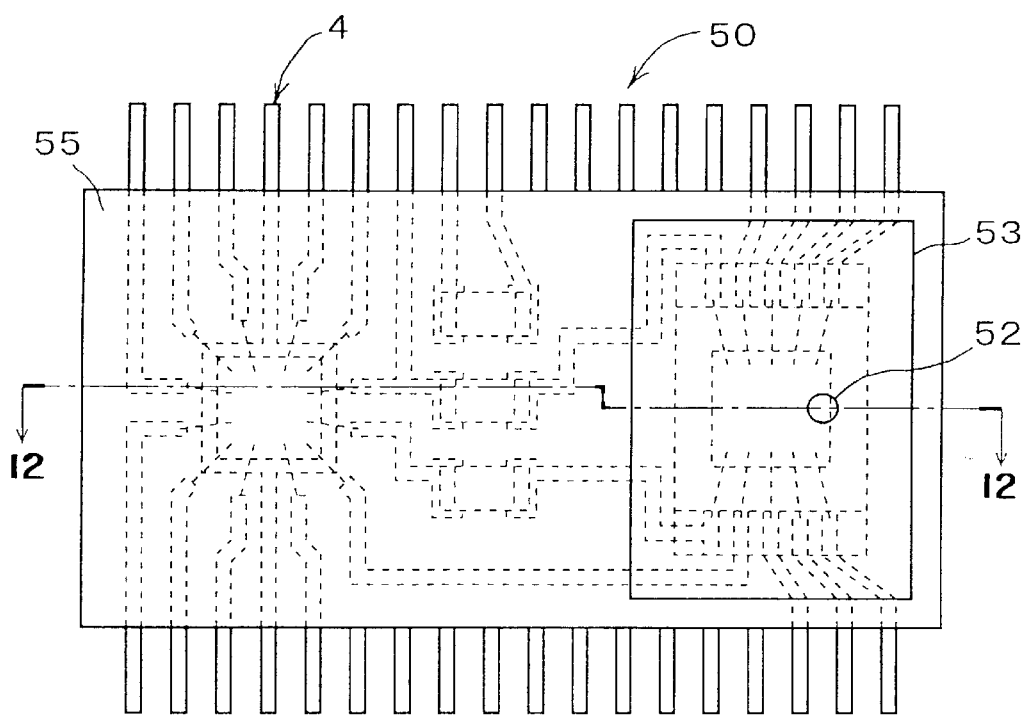
FIG. 11 is a plan view of a semiconductor pressure sensor according to the fourth embodiment of the invention.
Figure 12:
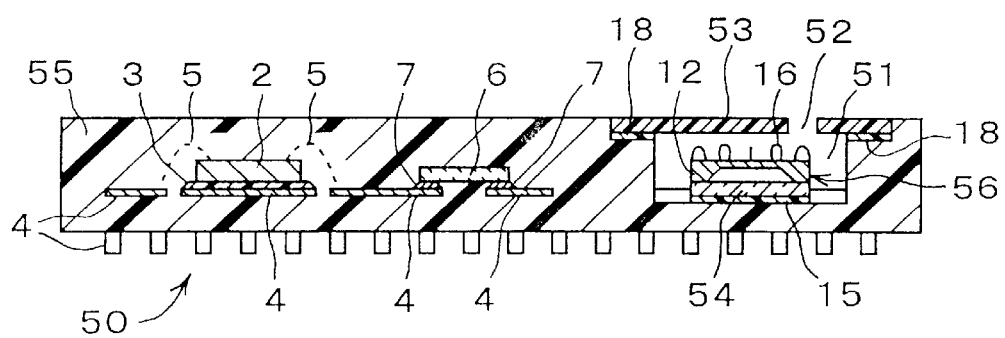
FIG. 12 is a cross sectional view through line E—E in FIG. 11.

FIG. 11 is a plan view of a semiconductor pressure sensor according to the fourth embodiment of the invention, and FIG. 12 is a cross sectional view through line E—E in FIG. 11. Note that like parts in FIG. 1 to FIG. 3 and FIGS. 11 and 12 are identified by like reference numbers, and further description thereof is omitted below where only the differences between this fourth embodiment and the first embodiment shown in FIG. 1 to FIG. 3 are described.

The semiconductor pressure sensor shown in FIG. 11 and FIG. 12 differs from that in FIGS. 1–3 in that the projection 10 forming the pressure opening 14 is not provided, and a through-hole is not provided in the bottom of the cavity 9. Therefore, the cavity 9 in FIG. 1 to FIG. 3 is referenced as cavity 51. A through-hole is also disposed in the cover 17 to form a pressure opening 52, and the cover 17 in FIGS. 1–3 is therefore referenced as cover 53. The pedestal 11 shown in FIGS. 1–3 is also replaced by a pedestal 54 having the same large rectangular plate-like shape but without a through-hole. As a result, the package 8 in FIGS. 1–3 is referenced as package 55, the pressure sensor unit 13 as pressure sensor unit 56, and the semiconductor pressure sensor 1 as semiconductor pressure sensor 50.

Referring to FIG. 11 and FIG. 12, a premolded resin package 55 is formed around the IC 2 and chip components 6. The package 55 is formed with a recessed cavity 51 in one part thereof. The pressure sensor unit 56 is formed by cathodically bonding the pressure sensor chip 12, which is formed with a thin wall diaphragm in the middle, to a flat, rectangular glass pedestal 54. The pressure sensor unit 56 is then fastened with the pedestal 54 bonded to the inside bottom of the cavity 51 using a silicon or other adhesive 15. Note that the thin diaphragm wall side of the pressure sensor chip 12 is bonded to the pedestal 54, and the gap formed by the diaphragm between the pedestal 54 and the pressure sensor chip 12 is made a vacuum at this time.

The specific wiring pattern of the lead frame 4 is also exposed inside the cavity 51, and the pressure sensor chip 12 is electrically connected using gold or other lead wires 16 to particular points of the lead frame wiring pattern inside the cavity 51.

The opening to the cavity 51 is covered by a resin cover 53 to protect the pressure sensor chip 12. This cover 53 is bonded in place using an epoxy, silicon, or other adhesive 18. A through-hole forming a pressure opening 52 for conveying the pressure-conveying medium to the cavity 51 is also formed in this cover 53, which is fit to the opening of the cavity 51 to seal the cavity 51. Note that as in the cavity 9 shown in FIG. 3 the bottom of cavity 51 is further recessed where the pressure sensor unit 56 is mounted so that this bottom part of the cavity 51 is below the surface on which the lead frame 4 is exposed.

Thus configured, the pressure sensor chip 12 detects the pressure of the pressure medium introduced through the pressure opening 52 by means of the change in the resistance of piezoresistors, for example. This detected pressure is then output by the pressure sensor chip 12 to the IC 2 and chip components 6 via the lead frame 4, and the IC 2 and chip components 6 then convert the detected pressure to an electrical signal, apply specific signal processing operations to this electrical signal, and communicate with the external devices connected to the lead frame 4.

As described above, the semiconductor pressure sensor of the fourth embodiment of the present invention features a general-purpose IC-like construction in which the IC 2 and chip components 6 forming the conversion circuit, signal processing circuit, and other peripheral circuitry of an absolute pressure detecting semiconductor pressure are encased in a resin molding containing in the same package a cavity 51 forming a hollow in which the pressure sensor unit 56 is mounted. A through-hole for the pressure opening is also formed in the cover 53 rather than in the bottom of the cavity 51, and a separate projection for forming the pressure opening is therefore unnecessary.

By thus integrating the pressure sensor chip, signal processing circuit, and peripheral circuitry in the same molded integrated package, the size of an absolute pressure detecting semiconductor pressure can be reduced and reliability can be assured by integrating the peripheral circuitry. By also reducing the number of moving parts, the manufacturing process can be simplified. Because the projection formed to provide a pressure opening is also eliminated, it is not necessary to provide a through-hole for said projection in the circuit board on which the semiconductor pressure sensor is mounted, and the sensor mounting efficiency can therefore be improved.

Embodiment 5

In an absolute pressure detecting semiconductor pressure according to the fourth embodiment above the IC 2, chip components 6, and pressure sensor unit 56 are mounted to the same side of the lead frame 4. It is also possible, however, to mount to both sides of the lead frame 4 as in the fifth embodiment of the invention described below.

Figure 13:
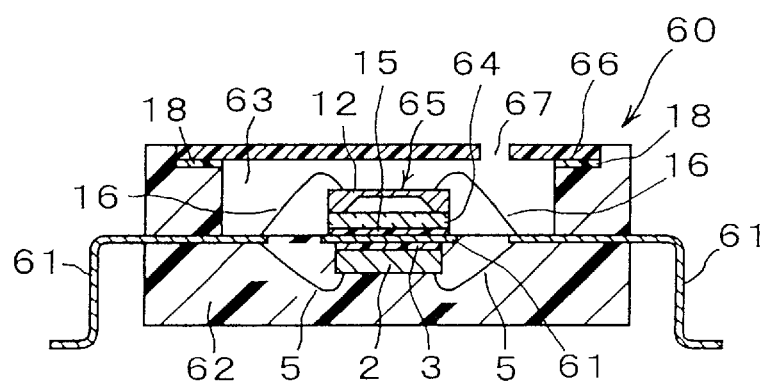
FIG. 13 is a cross sectional view of an absolute pressure detecting semiconductor pressure according to the fifth embodiment of the invention.

FIG. 13 is a cross sectional view of an absolute pressure detecting semiconductor pressure according to the fifth embodiment of the invention. Note that like parts in FIG. 1 to FIG. 3 and FIG. 13 are identified by like reference numbers, and further description thereof is omitted below.

In the semiconductor pressure sensor 60 shown in FIG. 13 the IC 2 comprising the conversion circuit, signal processing circuit, and other peripheral circuitry is bonded to particular points on one side of the lead frame 61 using adhesive 3, and is electrically connected by gold wires or other lead wires 5 to particular parts of the wiring pattern on lead frame 61. Capacitors, resistors, and other chip components 6 that cannot be formed in the IC 2 are electrically connected with solder 7 to particular points on one side of the lead frame 61.

A premolded resin package 62 is formed around the IC 2 and chip components 6. The package 62 is also formed with a large rectangular recessed cavity 63 on the other side of the lead frame 61. The pressure sensor unit 65 is formed by cathodically bonding the pressure sensor chip 12, which is formed with a thin wall diaphragm in the middle, to a flat, rectangular glass pedestal 64. The pressure sensor unit 65 is then fastened to the inside bottom of the cavity 63 using a silicon or other adhesive 15 with the pedestal 64 bonded to the cavity bottom. Note that the thin diaphragm wall side of the pressure sensor chip 12 is bonded to the pedestal 64, and the gap formed by the diaphragm between the pedestal 64 and the pressure sensor chip 12 is made a vacuum at this time.

The specific wiring pattern of the lead frame 61 is also exposed inside the cavity 63, and the pressure sensor chip 12 is electrically connected using gold or other lead wires 16 to particular points of the lead frame wiring pattern inside the cavity 63.

The opening to the cavity 63 is covered by a resin cover 66 to protect the pressure sensor chip 12. This cover 66 is bonded in place using an epoxy, silicon, or other adhesive 18. A through-hole forming a pressure opening 67 for conveying the pressure-conveying medium to the cavity 63 is also formed in this cover 66.

Thus configured, the pressure sensor chip 12 detects the pressure of the pressure medium introduced through the pressure opening 67 by means of the change in the resistance of piezoresistors, for example. This detected pressure is then output by the pressure sensor chip 12 to the IC 2 and chip components 6 via the lead frame 61, and the IC 2 and chip components 6 then convert the detected pressure to an electrical signal, apply specific signal processing operations to this electrical signal, and communicate with the external devices connected to the lead frame 61.

As described above, the semiconductor pressure sensor of the fifth embodiment of the present invention mounts the IC 2 and chip components to one side of the lead frame 61, features a general-purpose IC-like construction in which the IC 2 and chip components are encased in a resin molding containing in the same package a cavity 63 forming a hollow in which the pressure sensor unit 65 is mounted on the other side of the lead frame 61. A pressure opening 67 is then formed in the cover 66.

By thus mounting the IC 2, chip components, and pressure sensor unit 65 on both sides of the lead frame 61, it is possible, in addition to the effects of the fourth embodiment described above, to further reduce the overall size of the semiconductor pressure sensor as well as the circuit board area required to mount the semiconductor pressure sensor.

Embodiment 6

In the first embodiment above the IC 2, chip components 6, and pressure sensor unit 13 are all mounted on one side of one lead frame 4. It is also possible, however, to use two lead frames, mount the IC 2 and chip components 6 to one lead frame, mount the pressure sensor unit 13 to the other lead frame, and stack the two lead frames one over the other in a two-layer constructed as described according to the sixth embodiment below.

Figure 14:
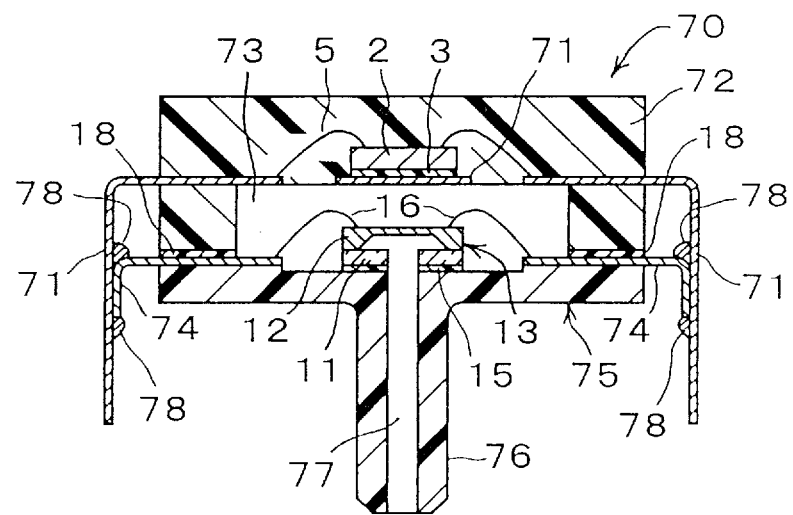
FIG. 14 is a cross sectional view of an absolute pressure detecting semiconductor pressure according to the sixth embodiment of the invention.

FIG. 14 is a plan view of an absolute pressure detecting semiconductor pressure according to the sixth embodiment of the invention. Note that like parts in FIG. 1 to FIG. 3 and FIG. 14 are identified by like reference numbers, and further description thereof is omitted below.

With the semiconductor pressure sensor 70 shown in FIG. 14 the IC 2 is bonded with an adhesive 3 to particular locations on one side of the lead frame 71 and is electrically connected by lead wires 5 to specific parts of the wiring pattern. Capacitors, resistors, and other chip components 6 that cannot be formed in the IC 2 are electrically connected with solder 7 to particular points of the lead frame 71.

A premolded resin package 72 is formed around the IC 2 and chip components 6. The package 72 is formed with a recessed cavity 73 on the other side of the lead frame 71. A cover 75 is also premolded around a sub-lead frame 74 with particular parts of the sub-lead frame 74 wiring pattern exposed.

A resin-molded cylinder-like projection 76 is also formed from the outside of the cover 75 from the side opposite that on which the sub-lead frame 74 is exposed. A through-hole is also formed inside the projection 76 to form a hollow cylinder, and this through-hole also passes through the cover 75. Note that the projection 76 is also formed during monolithic molding of the cover 75.

The pressure sensor unit 13 is formed by cathodically bonding the pressure sensor chip 12, which is formed with a thin wall diaphragm in the middle, to a flat, rectangular glass pedestal 11 having a through-hole in the center for introducing a pressure-conveying medium. The pressure sensor unit 13 is then fastened with the pedestal 11 thereof bonded by an adhesive 15 to the sub-lead frame 74 side of the cover 75 so that the through-holes in the projection 76 and pedestal 11 are aligned to form pressure opening 77. Note that the side of pressure sensor chip 12 in which the wall was thinned to form the diaphragm is bonded to the pedestal 11 so that approximately the center of the diaphragm is positioned over the pressure opening 77.

The pressure sensor chip 12 of the pressure sensor unit 13 bonded to the cover 75 is electrically connected by lead wires 16 to particular points of the sub-lead frame wiring pattern exposed on the cover 75. The cover 75 is then bonded to the opening of the cavity 73 so that the pressure sensor unit 13 is housed inside the cavity 73. Note that the cover 75 is bonded to the opening of the cavity 73 so that the cavity 73 is sealed in a vacuum state at this time.

The lead frame 71 externally exposed from the package 72 is also bent 90 degrees toward the cover 75, and is used both for electrical and mechanical connection to the wiring pattern of the circuit board to which the semiconductor pressure sensor 70 is mounted. The externally exposed part of the sub-lead frame 74 is also electrically connected with solder 78 to specific parts of the bent lead frame 71.

Note also that the face of the cover 75 to which the pressure sensor unit 13 is bonded is recessed below the surface from which the sub-lead frame 74 is exposed. This is because bonding a pedestal 11 to the pressure sensor chip 12 to form the pressure sensor unit 13 increases the height of the pressure sensor unit 13. It is therefore necessary to recess the pressure sensor unit mounting surface to avoid making the connections between the pressure sensor chip 12 and the sub-lead frame 74 of the cover 75 using bonded lead wires 16 too difficult.

Thus configured, the pressure sensor chip 12 detects the pressure of the pressure medium introduced through the pressure opening 77 by means of the change in the resistance of piezoresistors, for example. This detected pressure is then output by the pressure sensor chip 12 to the IC 2 and chip components 6 via the sub-lead frame 74 and lead frame 71, and the IC 2 and chip components 6 then convert the detected pressure to an electrical signal, apply specific signal processing operations to this electrical signal, and communicate with the external devices connected to the lead frame 71.

Figure 15:
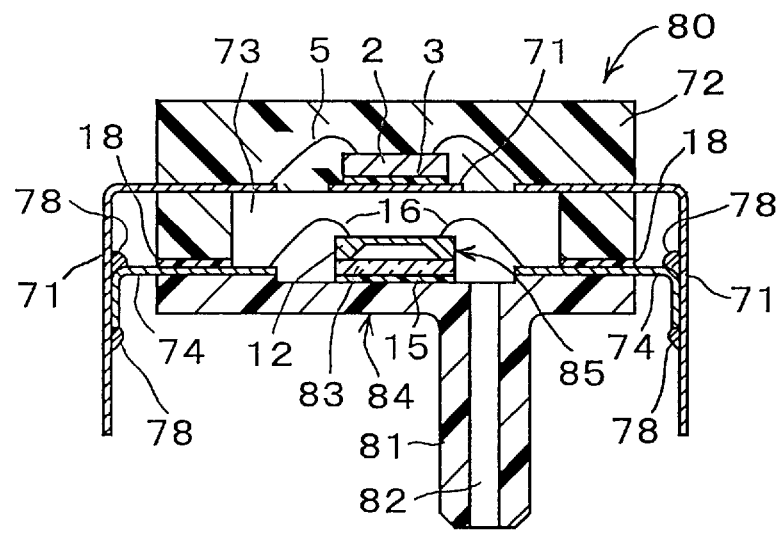
FIG. 15 is a cross sectional view of an absolute pressure detecting semiconductor pressure according to an alternative embodiment of the sixth embodiment of the invention.

It should be noted that while the present embodiment of the invention has been described with the pressure sensor unit 13 bonded to the cover 75 so that the pressure sensor chip 12 is disposed over the pressure opening 77, it is also possible in an absolute pressure detecting semiconductor pressure for the pressure sensor chip 12 to not be disposed above the pressure opening 77 as shown in FIG. 15. Note that like parts in FIGS. 14 and 15 are identified by like references, and further description thereof is omitted below where only the differences to FIG. 14 are described.

The semiconductor pressure sensor shown in FIG. 15 differs from that in FIG. 14 in that the pressure sensor chip 12 is not disposed over the pressure opening 77 and the pressure sensor unit 13 is disposed to not block the pressure opening 77. The projection 76 shown in FIG. 14 is therefore referenced as projection 81, and the pressure opening 77 as pressure opening 82. In addition, the pedestal 11 in FIG. 14 is formed as pedestal 83, which differs in the elimination of the through-hole. As a result, the cover 75 of FIG. 14 is referenced as cover 84, the pressure sensor unit 13 as pressure sensor unit 85, and the semiconductor pressure sensor 70 as semiconductor pressure sensor 80.

A premolding of the sub-lead frame 74 in FIG. 15 is manufactured with specific parts of the wiring pattern exposed from the surface of what becomes cover 84. A resin-molded cylinder-like projection 81 is also formed from the outside of the cover 84 from the side opposite that on which the sub-lead frame 74 is exposed. A through-hole is also formed inside the projection 81 to form a hollow cylinder, and this through-hole also passes through the cover 84. The resulting through-hole forms the pressure opening 82.

The pressure sensor unit 85 is formed by cathodically bonding the pressure sensor chip 12, which is formed with a thin wall diaphragm in the middle, to a flat, rectangular glass pedestal 83. The pressure sensor unit 85 is then fastened with the pedestal 83 thereof bonded by an adhesive 15 to the side of the cover 84 from which the sub-lead frame 74 is exposed. The pressure sensor unit 85 is positioned at this time so that it is not over the pressure opening 82 and does not block the pressure opening 82. Note that the side of pressure sensor chip 12 in which the wall was thinned to form the diaphragm is bonded to the pedestal 83, and the gap formed by the diaphragm between the pedestal 83 and the pressure sensor chip 12 is made a vacuum at this time.

Thus configured, the pressure sensor chip 12 detects the pressure of the pressure medium introduced to the cavity 73 through the pressure opening 82 by means of the change in the resistance of piezoresistors, for example. This detected pressure is then output by the pressure sensor chip 12 to the IC 2 and chip components 6 via the lead frame 71 and sub-lead frame 74, and the IC 2 and chip components 6 then convert the detected pressure to an electrical signal, apply specific signal processing operations to this electrical signal, and communicate with the external devices connected to the lead frame 71.

It should be noted that while the above embodiment of the invention has been described with reference to an absolute pressure detecting semiconductor pressure sensor, the sixth embodiment of the invention can also be applied to gauge pressure detecting semiconductor pressure sensors.

Figure 16:
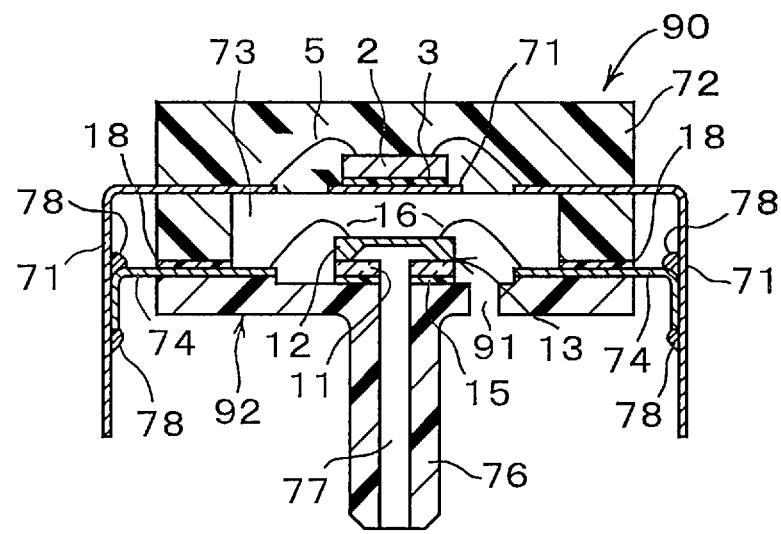
FIG. 16 is a cross sectional view of a gauge pressure detecting semiconductor pressure sensor according to the sixth embodiment of the invention.

FIG. 16 is a cross section of a gauge pressure detecting semiconductor pressure sensor according to the sixth embodiment of the invention.

The difference between the sixth embodiment shown in FIG. 16 and that in FIG. 14 is that a through-hole 91 is formed in the cover 75 to equalize the pressure inside the cavity 73 to the atmospheric pressure. As a result, this cover 75 is referenced as cover 92 below, and the semiconductor pressure sensor 70 is referenced as semiconductor pressure sensor 90. Other than this difference the semiconductor pressure sensor 90 is identical to the semiconductor pressure sensor 70 shown in FIG. 14, the through-hole 91 equalizes the internal pressure of the cavity 73 to the atmospheric pressure, and the pressure sensor chip 12 thus detects the relative pressure of the pressure-conveying medium introduced from the pressure opening 77 to the air pressure inside the cavity 73.

Note, further, that in FIG. 16 the thin-wall diaphragm side of the pressure sensor chip 12 can also be directly bonded with an adhesive 15 to the cover 92 without using a pedestal 11 so that approximately the center of the diaphragm is positioned over the pressure opening 77 as in the third embodiment above.

Figure 17:
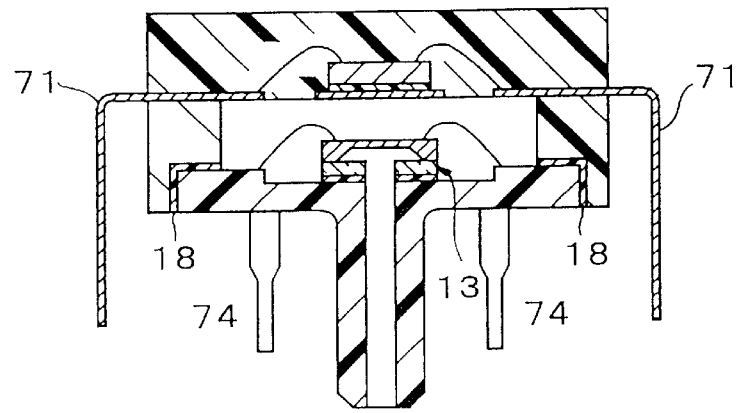
FIG. 17 is a cross sectional view of a semiconductor pressure sensor according to an alternative embodiment of the sixth embodiment of the invention.
Figure 18:
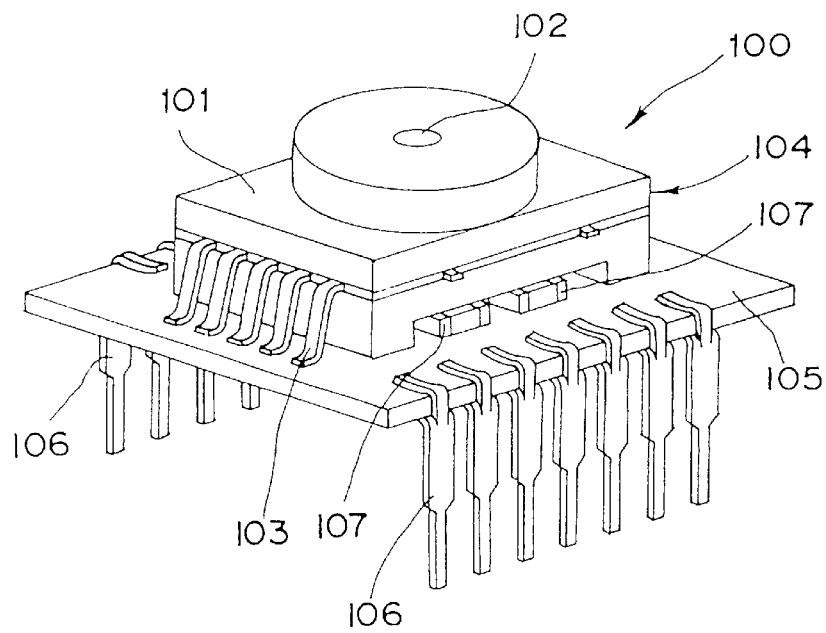
FIG. 18 is an overview of a conventional pressure sensor.

Note that in the semiconductor pressure sensors 70, 80, and 90 above the part of the sub-lead frame 74 protruding externally from the respective covers 75, 84, and 92 project perpendicularly to the direction in which the projection 76 extends. It is also possible, however, for the sub-lead frame 74 to be formed extending parallel to the projection 76 as shown in FIG. 17, in which case the electrical connection between the lead frame 71 and sub-lead frame 74 can be established using the lead wires or wiring pattern of the circuit board to which the semiconductor pressure sensor is mounted.

The semiconductor pressure sensor according to the sixth embodiment of the invention can achieve in addition to the effects of the first embodiment described above form a cavity 73 below the premolded part containing the IC 2 and chip components mounted on the lead frame, and mount the pressure sensor unit below the lead frame molding in a two-layer construction, thereby reducing unit size and reducing the circuit board area required for mounting the semiconductor pressure sensor. By further reducing the pedestal 11 in a gauge pressure detecting semiconductor pressure sensor, cost can also be further reduced.

Note, further, that in the first to fourth embodiments of the invention the electrical connection between the IC 2 and chip components 6 and the pressure sensor chip 12 is accomplished via a lead frame inside the package. Rather than making these connections inside the package, however, it is also possible to electrically connect the lead frame externally to the package using the wiring pattern or lead wires of the circuit board to which the semiconductor pressure sensor is mounted.

In each of the above embodiments the adhesives 3 and 15 may also be the same adhesive.

EFFECTS OF THE INVENTION

With a semiconductor pressure sensor according to the invention, the lead frame and peripheral circuitry mounted on the lead frame are encased in a full resin molding package similarly to a general-purpose integrated circuit device, a hollow cavity is formed in the same package, and the pressure sensor unit is mounted in this hollow cavity. By thus integrating the pressure sensor unit and peripheral circuitry in a molded resin package, the overall size of the device can be reduced, and reliability can be improved because the peripheral circuitry is integrated into the same package. It is also possible to reduce the number of moving parts, and the manufacturing process can be simplified.

In addition to providing a cavity for mounting the pressure sensor unit, the semiconductor pressure sensor according to the invention also provides a sub-cavity for mounting peripheral circuitry, mounts the pressure sensor unit in the cavity and mounts the peripheral circuitry to the lead frame inside the sub-cavity, then flows a sealing resin into the sub-cavity to achieve a structure similar to a general-purpose integrated circuit device. By thus integrating the pressure sensor unit and peripheral circuitry in a molded resin package, the overall size of the device can be reduced, and reliability can be improved because the peripheral circuitry is integrated into the same package. It is also possible to reduce the number of moving parts, and the manufacturing process can be simplified.

Furthermore, the pressure opening may be formed as a through-hole in the bottom of the cavity during package formation, and the pressure sensor unit is disposed and fastened above the pressure opening. By thus integrating the pressure sensor unit and peripheral circuitry in a molded resin package, the overall size of the device can be reduced, and reliability can be improved because the peripheral circuitry is integrated into the same package. It is also possible to reduce the number of moving parts, and the manufacturing process can be simplified.

A semiconductor pressure sensor according to the invention may also include a pressure sensor unit in which the pressure sensor chip having a diaphragm formed at approximately the center thereof, the thin-wall diaphragm side of the pressure sensor chip is bonded to the pedestal in which a through-hole is formed to introduce a pressure-conveying medium, said pedestal is fastened to the bottom of the cavity with the through-hole of the pedestal airtightly connected to the pressure opening, and said pressure sensor chip is electrically connected by corresponding lead wires to particular points of the lead frame exposed inside the cavity.

The resulting semiconductor pressure sensor is a general purpose sensor that can be used with either gauge pressure detecting systems or absolute pressure detecting systems. In addition, by integrating the pressure sensor unit and peripheral circuitry in a molded resin package, the overall size of the device can be reduced, and reliability can be improved because the peripheral circuitry is integrated into the same package. It is also possible to reduce the number of moving parts, and the manufacturing process can be simplified.

A semiconductor pressure sensor according to may also include a pressure sensor unit in which the pressure sensor chip has a diaphragm formed at approximately the center thereof, and the pressure sensor chip is disposed with the thin-wall diaphragm side thereof being bonded to the bottom of the cavity in a manner whereby the diaphragm is airtightly coupled with the pressure opening, and is electrically connected by corresponding lead wires to particular points of the lead frame exposed inside the cavity. It is therefore possible to further reduce unit cost for gauge pressure detecting semiconductor pressure sensors by eliminating the pedestal, reduce the number of moving parts, and simplify the manufacturing process. In addition, by integrating the pressure sensor unit and peripheral circuitry in a molded resin package, the overall size of the device can be reduced, and reliability can be improved because the peripheral circuitry is integrated into the same package.

A semiconductor pressure sensor according to the invention may further include the feature that when the cover is attached to the opening of the cavity, a vacuum is created in the cavity before sealing the cover to the opening. It is therefore possible to reduce the size of absolute pressure detecting semiconductor pressure sensors by integrating the pressure sensor unit and peripheral circuitry in a molded resin package, and reliability can be improved because the peripheral circuitry is integrated into the same package. It is also possible to reduce the number of moving parts, and to thereby simplify the manufacturing process.

A semiconductor pressure sensor according to the invention may also utilize a cover having a through-hole enabling the pressure inside the cavity to equalize the outside pressure. By thus integrating the pressure sensor unit and peripheral circuitry of a gauge pressure detecting semiconductor pressure sensor in a molded resin package, the overall size of the device can be reduced, and reliability can be improved because the peripheral circuitry is integrated into the same package. It is also possible to reduce the number of moving parts, and to thereby simplify the manufacturing process.

A semiconductor pressure sensor according to the invention may also form the pressure opening by providing a through-hole in the cover. It is therefore possible to eliminate the through-hole opened to provide a pressure opening in the circuit board to which the semiconductor pressure sensor is mounted, and to thereby improve mounting efficiency. By integrating the pressure sensor unit and peripheral circuitry in a molded resin package, the overall size of the device can also be reduced, and reliability can be improved because the peripheral circuitry is integrated into the same package. It is also possible to reduce the number of moving parts, and the manufacturing process can be simplified.

A semiconductor pressure sensor according to the invention may further utilize a pressure sensor chip having a diaphragm formed at approximately the center thereof, the thin-wall diaphragm side of the pressure sensor chip is bonded to a pedestal with a vacuum gap formed between the pressure sensor chip and pedestal, the pedestal is fastened to the bottom of the cavity, and said pressure sensor chip is electrically connected by corresponding lead wires to particular points of the lead frame exposed inside the cavity. It is therefore possible to reduce the size of absolute pressure detecting semiconductor pressure sensors by integrating the pressure sensor unit and peripheral circuitry in a molded resin package. Thus reducing the size also reduces the sensor footprint and the circuit board area required to mount the semiconductor pressure sensor. Reliability can also be improved because the peripheral circuitry is integrated into the same package, and the manufacturing process can be simplified because the number of moving parts is also reduced.

In a semiconductor pressure sensor according to the invention peripheral circuitry is mounted to one side of the lead frame and the peripheral circuitry is then encased in a full resin molding package similar to a general-purpose integrated circuit device. A hollow cavity is also formed on the other side of said lead frame, the pressure sensor unit is mounted in said cavity, and the pressure opening is formed by means of a through-hole in the cover. A two layer structure in which the pressure sensor unit and peripheral circuitry are mounted on both sides of the lead frame is thus achieved, and overall device size can be reduced by integrating the pressure sensor unit and peripheral circuitry in a molded resin package. Thus reducing the size also reduces the sensor footprint and the circuit board area required to mount the semiconductor pressure sensor. It is also possible to eliminate the through-hole opened to provide a pressure opening in the circuit board to which the semiconductor pressure sensor is mounted, and to thereby improve mounting efficiency. Reliability can also be improved because the peripheral circuitry is integrated into the same package, and the manufacturing process can be simplified because the number of moving parts is also reduced.

A semiconductor pressure sensor according to the invention may further utilize a pressure sensor unit that is characterized by the pressure sensor chip having a diaphragm formed at approximately the center thereof, the thin-wall diaphragm side of the pressure sensor chip being bonded to the pedestal with a vacuum gap formed between the pressure sensor unit and pedestal, the pedestal being fastened to particular points of the lead frame exposed inside the cavity, and the pressure sensor chip is electrically connected by corresponding lead wires to particular points of the lead frame exposed inside the cavity. It is therefore possible to reduce the size of absolute pressure detecting semiconductor pressure sensors by integrating the pressure sensor unit and peripheral circuitry in a molded resin package. Thus reducing the size also reduces the sensor footprint and the circuit board area required to mount the semiconductor pressure sensor. It is also possible to eliminate the through-hole opened to provide a pressure opening in the circuit board to which the semiconductor pressure sensor is mounted, and to thereby improve mounting efficiency. Reliability can also be improved because the peripheral circuitry is integrated into the same package, and the manufacturing process can be simplified because the number of moving parts is also reduced.

In a semiconductor pressure sensor according to the invention, the lead frame and peripheral circuitry mounted on the lead frame are encased in a full resin molding package similarly to a general-purpose integrated circuit device, a hollow cavity is formed in the same package on the side of the lead frame opposite that to which the peripheral circuitry is connected, and the pressure sensor unit is mounted on a molded resin cover containing the sub-lead frame such that the pressure sensor unit is housed inside the cavity in a two-layer device structure. It is therefore possible to reduce the overall device size by integrating the pressure sensor unit and peripheral circuitry in a molded resin package. Thus reducing the size also reduces the sensor footprint and the circuit board area required to mount the semiconductor pressure sensor. Reliability can also be improved because the peripheral circuitry is integrated into the same package, and the manufacturing process can be simplified because the number of moving parts is also reduced.

A semiconductor pressure sensor according to the invention may further utilize a pressure sensor unit that is characterized by the pressure sensor chip having a diaphragm formed at approximately the center thereof, the thin-wall diaphragm side of the pressure sensor chip being bonded to the pedestal in which a through-hole is formed to introduce a pressure-conveying medium, said pedestal is fastened to the cover with the through-hole of the pedestal airtightly connected to the pressure opening, and said pressure sensor chip is electrically connected by corresponding lead wires to particular points of the sub-lead frame exposed inside the cavity. The resulting semiconductor pressure sensor is a general purpose sensor that can be used with either gauge pressure detecting systems or absolute pressure detecting systems. In addition, by integrating the pressure sensor unit and peripheral circuitry in a two layer molded resin package, the overall size of the device can be reduced, and reliability can be improved because the peripheral circuitry is integrated into the same package. Thus reducing the size also reduces the sensor footprint and the circuit board area required to mount the semiconductor pressure sensor. The manufacturing process can also be simplified because the number of moving parts is reduced.

A semiconductor pressure sensor according to the invention may also include a pressure sensor unit that is a pressure sensor chip having a diaphragm formed at approximately the center thereof, and the pressure sensor chip is disposed with the thin-wall diaphragm side thereof being bonded to the cover in a manner whereby the diaphragm is airtightly coupled with the pressure opening, and is electrically connected by corresponding lead wires to particular points of the sub-lead frame exposed inside the cavity. It is therefore possible to further reduce unit cost for gauge pressure detecting semiconductor pressure sensors by eliminating the pedestal, reduce the number of moving parts, and simplify the manufacturing process. In addition, by integrating the pressure sensor unit and peripheral circuitry in a two layer molded resin package, the overall size of the device can be further reduced, thus also reducing the sensor footprint and the circuit board area required to mount the semiconductor pressure sensor.

A semiconductor pressure sensor according to may further utilize a pressure sensor unit that is characterized by the pressure sensor chip having a diaphragm formed at approximately the center thereof, the thin-wall diaphragm side of the pressure sensor chip being bonded to a pedestal with a vacuum gap formed between the pressure sensor chip and pedestal, and the pedestal being fastened to the cover in a manner not blocking the pressure opening. By thus integrating the pressure sensor unit and peripheral circuitry in a two layer molded resin package, the overall size of an absolute pressure detecting semiconductor pressure sensor can be reduced. Thus reducing the size also reduces the sensor footprint and the circuit board area required to mount the semiconductor pressure sensor. Reliability can also be improved because the peripheral circuitry is integrated into the same package. The manufacturing process can also be simplified because the number of moving parts is reduced.

A semiconductor pressure sensor according to the invention may further include the feature that when the cover is closed over the opening to the cavity, a vacuum is created in the cavity before sealing the cover. By thus integrating the pressure sensor unit and peripheral circuitry in a two layer molded resin package, the overall size of an absolute pressure detecting semiconductor pressure sensor can be reduced. Thus reducing the size also reduces the sensor footprint and the circuit board area required to mount the semiconductor pressure sensor. Reliability can also be improved because the peripheral circuitry is integrated into the same package. The manufacturing process can also be simplified because the number of moving parts is reduced.

A semiconductor pressure sensor according to cover having a pressure opening formed as a through-hole enabling the pressure inside the cavity to equal the outside pressure. By thus integrating the pressure sensor unit and peripheral circuitry in a two layer molded resin package, the overall size of gauge pressure detecting semiconductor pressure sensor can be reduced. Thus reducing the size also reduces the sensor footprint and the circuit board area required to mount the semiconductor pressure sensor. Reliability can also be improved because the peripheral circuitry is integrated into the same package. The manufacturing process can also be simplified because the number of moving parts is reduced.

A semiconductor pressure sensor according to the invention may further include the feature that the sub-lead frame is electrically connected at specific externally-exposed parts thereof to specific externally-exposed parts of the lead frame functioning as lead terminals for packaging the lead frame on a circuit board. By thus integrating the pressure sensor unit and peripheral circuitry in a two layer molded resin package, the overall size of the semiconductor pressure sensor can be reduced. Thus reducing the size also reduces the sensor footprint and the circuit board area required to mount the semiconductor pressure sensor. Reliability can also be improved because the peripheral circuitry is integrated into the same package. The manufacturing process can also be simplified because the number of moving parts is reduced.

A semiconductor pressure sensor according to the invention may further include the feature that specific parts of the lead frame and sub-lead frame are exposed externally as lead terminals for mounting on a circuit board. By thus integrating the pressure sensor unit and peripheral circuitry in a two layer molded resin package, the overall size of the semiconductor pressure sensor can be reduced. Thus reducing the size also reduces the sensor footprint and the circuit board area required to mount the semiconductor pressure sensor. Reliability can also be improved because the peripheral circuitry is integrated into the same package. The manufacturing process can also be simplified because the number of moving parts is reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor pressure sensor module comprising:
   a pressure sensor unit detecting the pressure of a pressure-conveying medium;
   peripheral circuitry converting the pressure detected by said pressure sensor unit to an electrical signal and processing said electrical signal;

a main lead frame electrically connecting said peripheral circuitry to said main lead frame;

a subsidiary lead frame electrically connecting said pressure sensor unit to said subsidiary lead frame;

said main lead frame electrically connected to said subsidiary lead frame;

a solid package body constructed with a molding resin said solid package body including a solid portion in which said peripheral circuitry is molded together with a part of said main lead frame, said solid package body including a surrounding wall formed downwardly from the bottom of said solid portion to define a concave portion; and a cover member adhesively bonded to the lower end of said surrounding wall, thereby closing an aperture of said concave portion;

said pressure sensor unit and said subsidiary lead frame fixedly arranged on the upper plane of said cover member and electrically connected with each other, and said cover member having a pressure introduction inlet introducing a pressure of the pressure-conveying medium into said concave portion.

2. A semiconductor pressure sensor module comprising:

a pressure sensor unit for detecting the pressure of a pressure-conveying medium;

peripheral circuitry converting the pressure detected by said pressure sensor unit to an electrical signal and processing said electrical signal;

a lead frame electrically connecting said peripheral circuitry and said pressure sensor unit to leads of said lead frame;

a solid package body constructed with a molding resin, said solid package body having a solid portion in which said peripheral circuitry is molded together with a part of said lead frame, a concave portion formed in said solid package body, said pressure sensor unit mounted to a bottom of said concave portion, said sensor unit electrically connected to lead tips of said lead frame that are exposed on the bottom of said concave portion;

a cover member joined to an aperture of said concave portion to enclose said pressure sensor unit arranged therein; and pressure introduction means for introducing the pressure of the pressure-conveying medium to a sensor portion of said pressure sensor unit through a pressure introducing hole.

3. The semiconductor pressure sensor module according to claim 1, wherein said solid package body has a flat plate configuration.

4. The semiconductor pressure sensor module according to claim 2, wherein said solid package body has another concave portion at the side of said solid portion for mounting parts of said peripheral circuitry, said another concave being filled with a molding resin after mounting said parts of said peripheral circuitry.

5. The semiconductor pressure sensor module according to claim 1, wherein said solid package body has a tubular portion projecting downwardly from the bottom of said concave portion, said tubular portion having a through hole forming said pressure introducing hole.

6. The semiconductor pressure sensor module according to claim 5, wherein said pressure sensor unit includes a sensor chip having a diaphragm at a center portion thereof, said sensor chip fixed on the bottom of said concave portion to a pedestal having a through hole introducing pressure from said through hole of said tubular portion.

7. The semiconductor pressure sensor module according to claim 1, wherein said pressure introducing means is an opening formed on said cover member.

8. The semiconductor pressure sensor module according to claim 1, wherein said solid portion and said concave portion of said solid package body are arranged in a stacked configuration.

9. The semiconductor pressure sensor module according to claim 8, wherein said concave porion is formed on said solid portion and said lead frame is fixed on the bottom of said concave portion.

10. The semiconductor pressure sensor module according to claim 9, wherein said peripheral circuitry is fixed on the lower side of said lead frame while said pressure sensor unit is arranged on the upper side of said lead frame.

11. The semiconductor pressure sensor module according to claim 10, wherein said pressure introduction means is an opening formed on said cover plate.

* * * * *